(12) United States Patent
Otsuka et al.

(10) Patent No.: US 6,749,819 B2
(45) Date of Patent: Jun. 15, 2004

(54) PROCESS FOR PURIFYING AMMONIA

(75) Inventors: Kenji Otsuka, Kanagawa-ken (JP); Satoshi Arawaka, Kanagawa-ken (JP); Takashi Kasaya, Kanagawa-ken (JP); Tomohisa Ikeda, Kanagawa-ken (JP)

(73) Assignee: Japan Pionics Co., Ltd., Tokyo (JP)

( * ) Notice: Subject to any disclaimer, the term of this patent is extended or adjusted under 35 U.S.C. 154(b) by 242 days.

(21) Appl. No.: 09/907,946

(22) Filed: Jul. 19, 2001

(65) Prior Publication Data
US 2002/0034467 A1 Mar. 21, 2002

(30) Foreign Application Priority Data

Jul. 28, 2000 (JP) ........................................ 2000-228287
Jul. 28, 2000 (JP) ........................................ 2000-228289

(51) Int. Cl.$^7$ .............................................. C01B 31/20
(52) U.S. Cl. ........................ 423/230; 423/219; 423/237; 423/239.2
(58) Field of Search ................................ 423/219, 230, 423/237, 239.1, 239.2

(56) References Cited

U.S. PATENT DOCUMENTS 4,910,007 A * 3/1990 Pinto et al. ................. 423/359
6,037,169 A * 3/2000 Sako et al. ............... 435/290.1

FOREIGN PATENT DOCUMENTS

| EP | 0 096 970 | 12/1983 |
| GB | 931 051 | 7/1963 |
| WO | WO 97/06104 | 2/1997 |
| WO | WO 00/20330 | 4/2000 |

OTHER PUBLICATIONS

Derwent Abstract, JP 06–107412, Apr. 19, 1994.

* cited by examiner

Primary Examiner—Stanley S. Silverman
Assistant Examiner—Edward M. Johnson
(74) Attorney, Agent, or Firm—Oblon, Spivak, McClelland, Maier & Neustadt, P.C.

(57) ABSTRACT

There are disclosed a process for purifying ammonia which comprises bringing crude ammonia into contact with a catalyst comprising manganese oxide as an effective ingredient to remove oxygen and/or carbon dioxide that are contained as impurities in the ammonia, and a process for purifying ammonia which comprises bringing crude ammonia into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia. It is made possible by the above process to remove impurities to an extremely low concentration from crude ammonia available on the market for industrial use and crude ammonia from a gallium nitride compound semi-conductor without decomposition of ammonia to generate hydrogen.

17 Claims, 3 Drawing Sheets

(A)  (B)

PROCESS FOR PURIFYING AMMONIA

BACKGROUND OF THE INVENTION

1. Field of the Invention

The present invention relates to a process for purifying ammonia. More particularly, the present invention pertains to a process for purifying ammonia, capable of removing impurities such as oxygen, carbon dioxide and water to an extremely low concentration that are contained in ammonia, for instance, crude ammonia available on the market for industrial use or crude ammonia which is recovered from a gallium nitride compound semiconductor process.

2. Description of the Related Arts

Ammonia is used together with silane for the formation of a silicon nitride film and also together with triethyl gallium and the like for the formation of a gallium nitride film each in a semiconductor process. In particular, a production process for a gallium nitride compound semi-conductor which is widely employed as an element for a light emitting diode and laser diode is put into practice usually by subjecting a gallium nitride compound to vapor phase growth on a substrate made of sapphire or the like by means of MOCVD process. Examples of feed gases that are used in the above-mentioned process include a trimethylated group III element such as trimethyl gallium, trimethyl indium and trimethyl aluminum and besides ammonia, that is, a compound of a group V element. Accompanying the progress in film formation technique in recent year, ammonia to be used therein is forcefully required to have an extremely high purity. Because of the aforesaid requirement and a large amount to be used, there is required to develop a process for purifying ammonia capable of continuously supplying highly pure ammonia.

In general, ammonia available on the market for industrial use contains oxygen, carbon dioxide, moisture, etc. Ammonia having a relatively high purity is marketed in the form obtained by further distilling or rectifying the ammonia available on the market, or in the form obtained by further diluting with a highly pure inert gas. However, since ammonia to be used as a feed gas in a semiconductor process and the like as mentioned above is required to have an extremely high purity, there has hitherto been developed a process for further purifying ammonia having a relatively high purity obtained by further distilling or rectifying ammonia for industrial use.

As a process for purifying ammonia, there have previously been available ① an ammonia purifying process in which carbon dioxide gas in crude ammonia is adsorptively removed by passing crude ammonia through a solid alkali layer maintained at such a temperature as higher than the temperature at which the solid alkali is no longer dissolved due to the deliquescent property of the solid alkali and also at such a temperature as lower than the melting point thereof {refer to Japanese Patent Application Laid-Open No. 24737/1994 (Heisei 6)} and ② an ammonia purifying process in which moisture in crude ammonia is removed by bringing the crude ammonia into contact with BaO as a simple substance or a mixture comprising BaO as s principal component under the condition of substantially room temperature {refer to Japanese Patent Application Laid-Open No. 142833/1997(Heisei 9)}.

In addition, there have also been developed ③ an ammonia purifying process in which oxygen contained in crude ammonia is removed by bringing the crude ammonia into contact with a catalyst comprising nickel as a principal component {refer to Japanese Patent Application Laid-Open No. 124813/1993(Heisei 5)}, ④ an ammonia purifying process in which carbon monoxide and carbon dioxide that are contained in crude ammonia are removed by bringing the crude ammonia into contact with a catalyst comprising nickel as a principal component {refer to Japanese Patent Application Laid-Open No. 107412/1994 (Heisei 6)}, etc.

However, the ammonia purifying processes ① and ② have suffered from the disadvantages in that although the process ① can remove only carbon dioxide gas and the process ② can remove only moisture, each of the processes must be frequently combined with an other process to purify the ammonia in order that the process is employed in a semiconductor process. Moreover with regard to the ammonia purifying processes ③ and ④, in the case of a high contact temperature between the catalyst and ammonia, there is a fear of hydrogen generation due to ammonia decomposition, hence necessitating to purify the ammonia by maintaining the contact temperature at around ordinary temperature. Further, in the above-mentioned gallium nitride compound semiconductor process, because of low decomposition efficiency of ammonia, an extremely large amount thereof is required to be used as the feed gas compared with trimethylated group III element such as trimethyl gallium, trimethyl indium and trimethyl aluminum. The ammonia employed as the feed gas in the foregoing semiconductor process is highly pure ammonia which is obtained by distilling or rectifying ammonia for industrial use, or is ammonia obtained by further purifying the aforesaid highly pure ammonia. Thus, it has been impossible to employ ammonia available on the market for industrial use as it is.

In addition thereto, the ammonia available on the market subjected to distillation or rectification costs several ten times as compared with ammonia available on the market for industrial use.

By the reasons mentioned hereinbefore, the ammonia available on the market subjected to distillation or rectification suffers from the drawback in that it leads to an extremely high running cost, particularly in a gallium nitride compound semiconductor process, and what is more, most of it has been discarded in a large amount without being reacted or utilized in the above-mentioned process. In such circumstances, it has eagerly been desired to develop an ammonia purification process capable of continuously supplying the semiconductor process with ammonia, and at the same time, of contributing to the production of the semiconductor at a reasonable cost.

Further, most of the ammonia having extremely high purity, after being exhausted from the semiconductor process, has been treated by a wet absorption process, a combustion treatment process, a dry adsorption process or a decomposition treatment process. However, the above-mentioned processes involves such problems still remain unsolved as described hereunder. The wet absorption process which comprises neutralizing the ammonia by passing it through an acidic aqueous solution is problematic in the post treatment of by-produced ammonium salts. The combustion treatment process which comprises burning the ammonia by introducing into the flame of a fuel such as propane is problematic in fuel consumption, NOx treatment and $CO_2$ generation. The dry adsorption process which comprises bringing the ammonia into contact with a chemical agent having chemical reactivity with the ammonia is problematic in high running cost due to the use of an expensive chemical agent. The decomposition treatment which comprises decomposing the ammonia into nitrogen and hydrogen by bringing the ammonia into contact with an ammonia decomposition catalyst is problematic in high running cost due to large electric power consumption.

An efficient recovery and recycle of the ammonia thus used, if made possible, can contribute to not only the effective utilization of a resource but also environmental preservation.

SUMMARY OF THE INVENTION

Under such circumstances, a general object of the present invention is to provide a process for purifying ammonia, capable of removing impurities such as oxygen, carbon dioxide and moisture that are contained in ammonia each in a slight amount to an extremely low concentration, and of preventing hydrogen from being generated by the decomposition of ammonia even at a relatively high contact temperature.

Another object of the present invention is to provide a process for purifying ammonia, capable of readily producing ammonia which is usable as a feed gas for a gallium nitride-compound semiconductor from crude ammonia available on the market for industrial use or crude ammonia which is recovered from a gallium nitride compound semiconductor process.

Other objects of the present invention will be obvious from the text of this specification hereinafter disclosed. Under such circumstances, intensive extensive research and investigation were made by the present inventors in order to achieve the above-mentioned object. As a result, it has been found that oxygen, carbon dioxide and moisture contained in crude ammonia as impurities can be removed to as low as 0.1 ppm or to less than 0.01 ppm by bringing the crude ammonia into contact with a catalyst comprising manganese oxide as an effective ingredient, preferably further with a synthetic zeolite having a pore diameter in the range of 4 to 10 Å or equivalent and that manganese oxide is a catalyst which is less prone to decompose ammonia. Such finding led to the ammonia purification process according to one aspect of the present invention.

In addition, it has been found that, if it is made possible to remove oxygen, carbon dioxide and moisture which exert evil influence upon a gallium nitride compound semiconductor process each to an extremely low concentration from crude ammonia available on the market for industrial use or from crude ammonia recovered out of a gallium nitride compound semiconductor process, then the purified ammonia can be used as a feed gas to a gallium nitride compound semiconductor.

Moreover, it has been found that oxygen, carbon dioxide and moisture contained as impurities in crude ammonia available on the market for industrial use or in crude ammonia recovered from a gallium nitride compound semiconductor process can be removed to as low as 0.1 ppm or to less than 0.01 ppm by bringing the crude ammonia into contact with a catalyst comprising manganese oxide and/or nickel as an effective ingredient, and further with a synthetic zeolite having a pore diameter in the range of 4 to 10 Å or equivalent. Such finding led to the ammonia purification process according to another aspect of the present invention.

That is to say, the present invention provides:

1. A process for purifying ammonia which comprises bringing crude ammonia into contact with a catalyst comprising manganese oxide as an effective ingredient to remove oxygen and/or carbon dioxide that are contained as impurities in the foregoing crude ammonia.

2. A process for purifying ammonia which comprises bringing crude ammonia into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia.

3. A process for purifying ammonia to be used as a feed gas for a gallium nitride compound semiconductor which comprises bringing crude ammonia available on the market for industrial use into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia.

4. A process for purifying ammonia to be used as a feed gas for a gallium nitride compound semiconductor which comprises bringing crude ammonia available on the market for industrial use into contact with a catalyst comprising nickel as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia.

5. A process for purifying ammonia to be used as a feed gas for a gallium nitride compound semiconductor which comprises bringing crude ammonia available on the market for industrial use into contact with a catalyst comprising manganese oxide as an effective ingredient and with a catalyst comprising nickel as an effective ingredient consecutively in this order, and thereafter bringing the ammonia into contact with a synthetic zeolite having a pore diameter in the range of 4 to 10 Å to remove at least one impurity selected from the group consisting of oxygen, carbon dioxide and moisture that are contained in the foregoing crude ammonia.

6. A process for purifying ammonia to be used as a feed gas for a gallium nitride compound semiconductor which comprises bringing crude ammonia available on the market for industrial use into contact with a catalyst comprising nickel as an effective ingredient and with a catalyst comprising manganese oxide as an effective ingredient consecutively in this order, and thereafter bringing the ammonia into contact with a synthetic zeolite having a pore diameter in the range of 4 to 10 Å to remove at least one impurity selected from the group consisting of oxygen, carbon dioxide and moisture that are contained in the foregoing crude ammonia.

7. A process for purifying ammonia to be used as a feed gas for a gallium nitride compound semiconductor which comprises the step of bringing crude ammonia available on the market for industrial use into contact with a catalyst comprising manganese oxide as an effective ingredient, and thereafter with a synthetic zeolite having a pore diameter in the range of 4 to 10 Å and the step of bringing the ammonia from the synthetic zeolite into contact with a catalyst comprising nickel as an effective ingredient, and thereafter with a synthetic zeolite having a pore diameter in the range of 4 to 10 Å consecutively in this order to remove at least one impurity selected from the group consisting of oxygen, carbon dioxide and moisture that are contained in the foregoing crude ammonia.

8. A process for purifying ammonia to be used as a feed gas for a gallium nitride compound semiconductor which comprises the step of bringing crude ammonia available on the market for industrial use into contact with a catalyst comprising nickel as an effective ingredient, and thereafter with a synthetic zeolite having a pore diameter in the range of 4 to 10 Å and the step of bringing the ammonia from the synthetic zeolite into contact with a catalyst comprising manganese oxide as an effective ingredient, and thereafter with a synthetic zeolite having a pore diameter in the range of 4 to 10 Å consecutively in this order to remove at least one impurity selected from the group consisting of oxygen, carbon dioxide and moisture that are contained in the foregoing crude ammonia.

9. A process for purifying ammonia to be used as a feed gas for a gallium nitride compound semiconductor which comprises bringing crude ammonia recovered from a a gallium nitride compound semiconductor process into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia.

10. A process for purifying ammonia to be used as a feed gas for a gallium nitride compound semiconductor which comprises bringing crude ammonia recovered from a gallium nitride compound semiconductor process into contact with a catalyst comprising nickel as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia.

Figure 1:
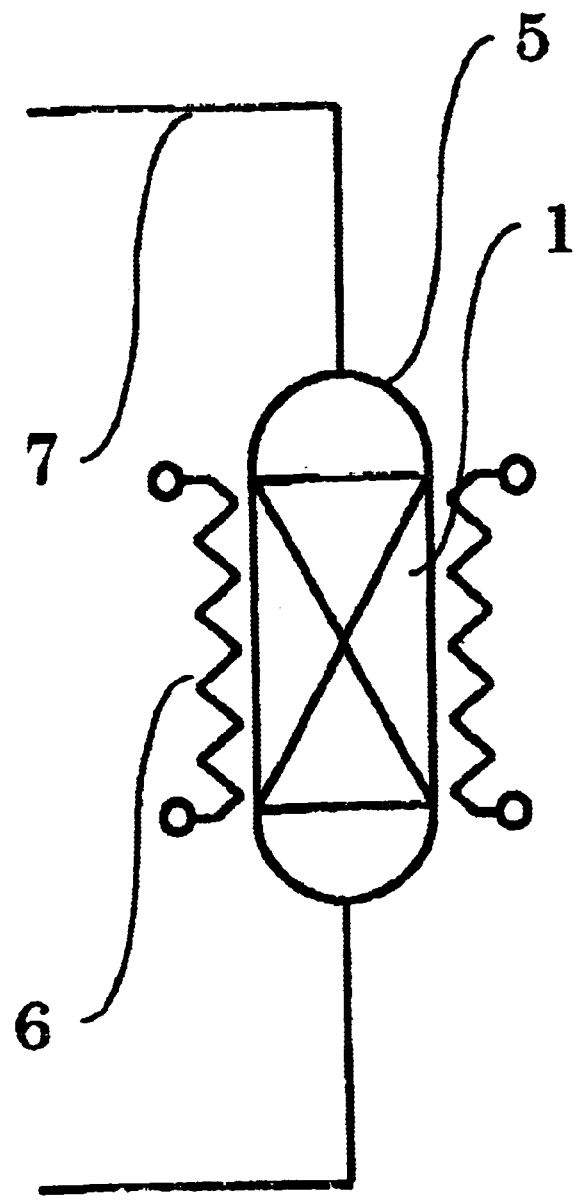
FIG. 1 is a schematic illustration showing an example of the construction for a purification line to carry out ammonia purification process according to the present invention.

In each of the illustrations, the symbols shall have the following designation.

1: catalyst comprising manganese oxide or nickel as an effective ingredient 2: synthetic zeolite having a pore diameter in the range of 4 to 10 Å 3: catalyst column 4: adsorption column 5: purification column 6: heater 7: crude ammonia supply line 8: exhaust line of ammonia from a gallium nitride compound semiconductor process 9, 15, 17, 20, 22, 25, 27 and 29: valve 10: adsorber 11: adsorption tube 12: adsorbent 13: heat transfer medium inlet 14; heat transfer medium outlet 16: exhaust line 18: ammonia recovery line 19: vacuum pump 21: exhaust gas circulation line 23: buffer tank 24: pressurizing pump 26: recovered ammonia tank 28: surge tank

DESCRIPTION OF THE PREFERRED EMBODIMENTS

The present invention is applied to the removal of at least one impurity selected from oxygen, carbon dioxide and moisture that are contained in ammonia alone or ammonia which has been diluted with hydrogen (hydrogen-based gas) or an inert gas such as nitrogen and argon (inert gas-based gas){hereinafter referred collectively to as "crude ammonia"}. In particular, the present invention, which relates a process for purifying ammonia to be used as a raw material of the group V, is applied to the removal of at least one impurity selected from oxygen, carbon dioxide and moisture that are contained in crude ammonia available on the market for industrial use or crude ammonia recovered from a gallium nitride compound semiconductor process.

The present invention relates to a process for purifying ammonia which comprises bringing crude ammonia into contact with a catalyst comprising manganese oxide as an effective ingredient to remove oxygen and/or carbon dioxide that are contained as impurities in the foregoing crude ammonia (first aspect of the present invention); to a process for purifying ammonia which comprises bringing crude ammonia into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia(second aspect); and to a process for purifying ammonia which comprises bringing crude ammonia into contact with a catalyst comprising manganese oxide and/or nickel as an effective ingredient, and thereafter with a synthetic zeolite having a pore diameter in the range of 4 to 10 Å to remove at least one impurity selected from the group consisting of oxygen, carbon dioxide and moisture that are contained in the foregoing crude ammonia(third aspect).

The catalyst comprising manganese oxide as an effective ingredient among the catalysts to be used in the process for purifying ammonia according to the present invention comprises MnO, $Mn_3O_4$, $Mn_2O_3$, $MnO_2$ or the like as a principal component. In the present invention, the catalyst is not restricted by the production process of manganese oxide, and it has a BET specific surface area preferably in the range of 10 to 500 $m^2/g$. The use of a manganese oxide catalyst having a BET specific surface area smaller than 10 $m^2/g$ causes a fear of decrease in the amount of removed impurities per unit amount of the catalyst. Conversely, the use thereof having a BET specific surface area larger than 500 $m^2/g$ enables efficient removal of impurities, however the production of itself is difficult.

The catalyst comprising manganese oxide as a principal component may be procured from marketed products for use as such, or may be produced by a well known process. With regard to the process for producing manganese oxide, MnO is produced, for instance, by heating $MnCO_3$ or $Mn(OH)_2$ at around 500° C. in the absence of oxygen or by reducing a higher-grade manganese oxide in a stream of $H_2$ or CO. $Mn_3O_4$ is readily produced by igniting a manganese-containing compound (an oxide, hydroxide, sulfate or carbonate thereof) at around 1000° C. in the air or in a stream of oxygen. $Mn_2O_3$ is produced, for instance, by heating a manganese salt excluding a sulfate thereof at 600 to 800° C. in the air. $MnO_2$ is produced by stirring and mixing dilute aqueous solution of potassium permanganate, dilute aqueous solution of manganese sulfate and concentrated sulfuric acid under heating, washing the resultant precipitate, and drying the same.

It is preferable in the case of producing the catalyst to add a binder at the time of preparing the same in order to enhance the moldability and molding strength of the catalyst. The binder is exemplified by alumina sol, silica sol and the like.

The amount of a binder, when added, is at most 10% by weight based on the total weight of the catalyst, preferably at most 5% by weight based thereon. A component other than the manganese oxide such as a metal including chromium, iron, cobalt and copper and an oxide thereof may be incorporated in a small amount, however the content of manganese oxide as the principal component is usually at least 70% by weight based on the total weight of the catalyst, preferably at least 90% by weight based thereon.

The shape, form and size of the catalyst is not specifically limited. The above-mentioned catalyst may be spherical, columnar, cylindrical or granular. It has a diameter of approximately 0.5 to 10 mm for spherical form; a diameter of approximately 0.5 to 10 mm and a height of approximately 2 to 20 mm for columnar form such as pellet and tablet; and a mesh opening of approximately 0.84 to 5.66 mm for irregular form such as granule. The packing density of the catalyst, when packed in a purification column, varies depending upon the shape and preparation method, and is usually 0.4 to 2.0 g/ml approximately.

The catalyst comprising nickel as an effective ingredient among the catalysts that are used in the ammonia purification process according to the present invention comprises, as principal component, metallic nickel or a nickel compound such as nickel oxide that is more prone to be subjected to reduction. The above-mentioned catalyst may be incorporated, as a metal compound other than nickel, with a small amount of a metal such as chromium, iron, cobalt and copper. It may be used alone without a catalyst carrier or in the form supported on a catalyst carrier or the like, of which is usually preferable the form supported on a catalyst carrier or the like for the purpose of enhancing the contacting efficiency between the nickel surface and gas.

The method for supporting nickel on a carrier is exemplified, for instance, by a method comprising the steps of dispersing in aqueous solution of a nickel salt, a powdery carrier such as diatomaceous earth, alumina, silica/alumina, aluminosilicate and calcium silicate; further adding an alkali to deposit the nickel component on the powdery carrier; filtering the resultant slurry; washing it with water as necessary; drying the resultant cake at 120 to 150° C.; calcining the dried cake at 300° C. or higher; and grinding the calcined cake, and also a method comprising the steps of calcining inorganic nickel salt such as $NiCO_3$, $Ni(OH)_2$ and $Ni(NO_3)_2$, organic nickel salt such as $NiC_2O_4$ and $Ni(CH_3COO)_2$; grinding the calcined product; thereafter mixing the same with heat resistant cement; and calcining the mixture.

The catalytic product thus obtained is usually made into a molded product by means of extrusion molding, tabletting molding or the like, which is put into service as such or after being crushed into a proper size as required. As the molding method, dry method and wet method are usable along with a small amount of water and a lubricant.

Further, the nickel-based catalyst may be selected for use, for instance from marketed products such as N-111(N-diatomaceous earth, available from JGC Corporation) and the like, which are available on the market. In summary, the reduced nickel, nickel oxide or the like needs only to be minutely dispersed, large in specific surface area and high in contacting efficiency.

The BET specific surface area of the catalyst comprising nickel as an effective ingredient is usually 10 to 300 $m^2/g$, preferably 30 to 250 $m^2/g$. The nickel content is usually 5 to 95% by weight, preferably 20 to 95% by weight based on the total weight of the catalyst. The nickel content, when being lower than 5% by weight based thereon, brings about decrease in oxygen removing capacity, whereas the content, when being higher than 95% by weight based thereon, gives rise to a fear of lowering the catalytic activity due to the generation of sintering upon the reduction with hydrogen.

In the process for purifying ammonia according to the present invention, the catalyst comprising manganese oxide or nickel as an effective ingredient is, prior to use, usually subjected to hydrogen reduction for the purpose of activation. The hydrogen reduction can be put into practice by passing, for instance, a mixed gas of hydrogen and nitrogen at 350° C. or lower at a superficial linear velocity (LV) of approximately 5 cm/sec.

The synthetic zeolite which has a pore diameter in the range of 4 to 10 Å or equivalent and which is employed in the ammonia purification process according to the present invention is, from chemical aspect, the synthetic zeolite, for instance, in which the sodium segment of a hydrated sodium salt of synthetic crystalline aluminosilicate is replaced in part with potassium. The crystalline synthetic zeolite is characterized by its having in the inside of crystals, and a large number of pores that are almost uniform in pore size. The synthetic zeolite is usually molded into a spherical form having a mesh size of 4 to 20, a columnar form having a diameter of 1.5 to 4 mm and a height of 5 to 20 mm or the like so that it can be efficiently used. Marketed synthetic zeolite which meets the requirements as mentioned above is exemplified by Molecular Sieves 4A, 5A and 13X (available from Union Carbide Corporation in U.S.A. or Union Showa Co.,Ltd.). Prior to use, the synthetic zeolite is usually activated at 200 to 350° C. approximately in a stream of an inert gas.

The crude ammonia available on the market for industrial use is e.g. marketed ammonia which has been synthesized by high pressure reaction between hydrogen and nitrogen, and packed in a cylinder or the like as liquefied ammonia. Such crude ammonia is warranted to have a purity of at least 99.9% or 99.99% and contains such impurities as oxygen, carbon dioxide and moisture in addition to hydrogen and nitrogen. Incidentally, most of the ammonia having a relatively high purity produced by distilling or rectifying the crude ammonia available on the market for industrial use has each of the impurities being 1 ppm or less.

An exhaust gas which is exhausted from a gallium nitride compound semiconductor process usually contains hydrogen and nitrogen each in several ten % as impurities in addition to ammonia as the principal component. Incidentally, it is made possible to recover ammomia having a high concentration at a high recovery rate from the above-mentioned exhaust gas by utilizing, for instance, a recovery process and a recovery apparatus for ammonia that were developed by the present applicant {Japanese Patent Application Laid-Open No. 317246/2000 (Heisei 12)}.

Ammonia purification by using catalyst alone comprising manganese oxide as the effective ingredient is carried out by passing crude ammonia through a catalyst column as illustrated in FIG. 1 packed inside with a catalyst comprising manganese oxide subjected to reduction treatment as the effective ingredient. In the case of using both the foregoing catalyst and a synthetic zeolite having a pore diameter of 4 to 10 Å or equivalent, ammonia purification is effected by passing crude ammonia through a catalyst column and an adsorbent column packed inside with the aforesaid synthetic zeolite having a pore diameter of 4 to 10 Å or equivalent as illustrated in FIG. 2(A).

Figure 3:
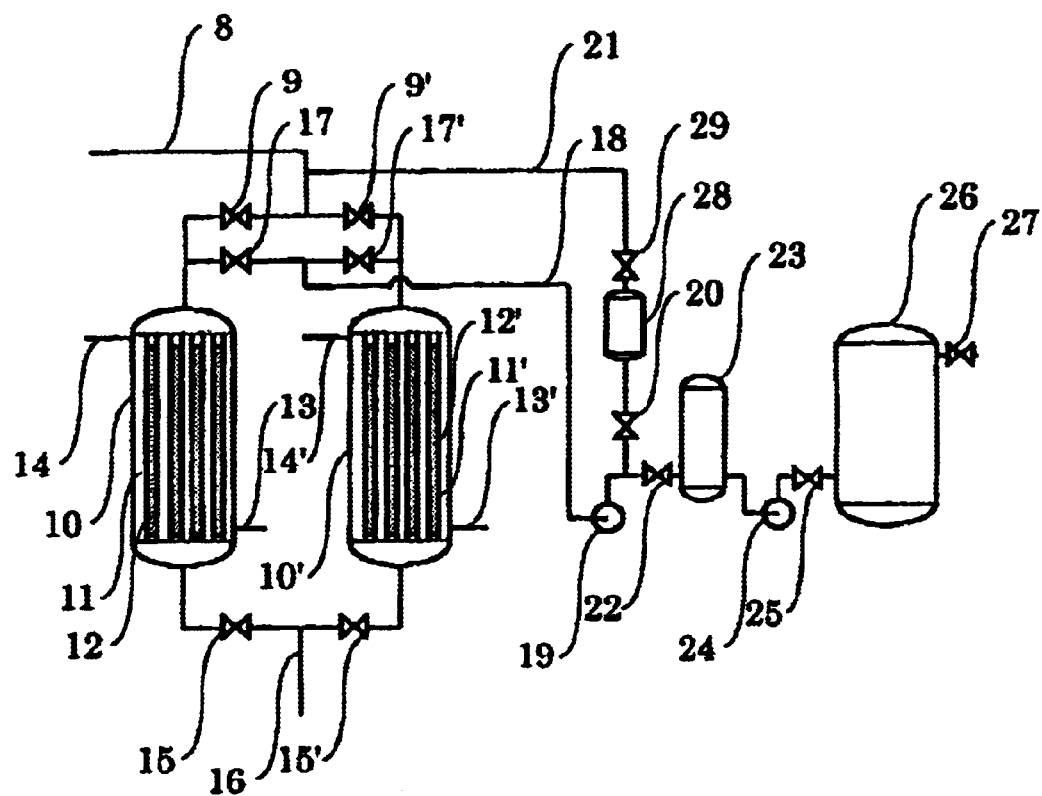
FIG. 3 is a schematic illustration showing an example of construction for a recovery unit to recover ammonia from a gallium nitride compound semiconductor process according to the present invention.

The above-mentioned ammonia recovery unit is such a unit as illustrated in FIG. 3, and comprises a shell and multi-tube type adsorber 10 having such a construction as enabling a heat transfer medium to pass through the outside of a plurality of adsorption tubes 11 that are incorporated thereinto and packed inside with an ammonia adsorbent 12, and an evacuation pump 19 for the purpose of evacuating the inside of the adsorber, which is constituted such that an ammonia-containing gas is passed through the adsorption tubes 11 and adsorbed onto the adsorbent 12, while the adsorber is cooled, and thereafter the ammonia is desorbed off the adsorbent 12 under vacuum and recovered, while the adsorber is heated with the heat transfer medium. The recovery method facilitates the production of ammonia having a purity comparable to that of ammonia for industrial use.

It is made possible by the ammonia purification process according to the present invention to remove impurities such as oxygen, carbon dioxide and moisture so as to attain an extremely low concentration, said impurities being contained in crude ammonia available on the market for industrial use or crude ammonia recovered from a gallium nitride compound semiconductor process. However, when crude ammonia contains nitrogen and a large amount of hydrogen, it is impossible to remove the same. When crude ammonia contains nitrogen and hydrogen each in a low concentration, it is made possible to use the ammonia which is purified by the ammonia purification process according to the present invention, since nitrogen and hydrogen are used in a large amount upon the production of a gallium nitride compound semiconductor, thus not exerting evil influence on the semiconductor process.

Ammonia purification is carried out usually by passing crude ammonia through a catalyst column packed inside with a catalyst comprising manganese oxide or nickel which has been subjected to reduction treatment as an effective ingredient and an adsorption column packed inside with the synthetic zeolite having a pore diameter of 4 to 10 Å or equivalent which has been subjected to activation treatment as illustrated in FIG. 2(A).

Figure 2:
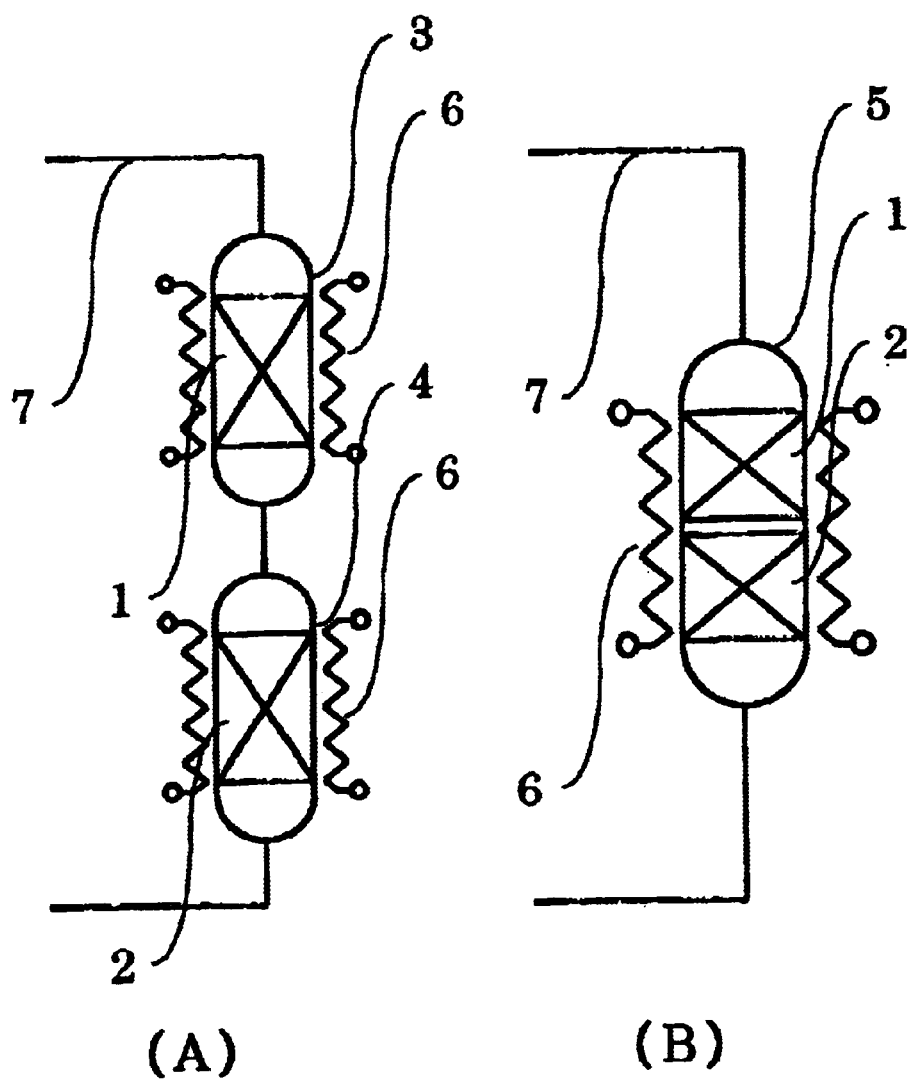
FIG. 2 is a schematic illustration showing another example of the construction for a purification line to carry out ammonia purification process according to the present invention.

In the ammonia purification process according to the present invention, oxygen and carbon dioxide are principally removed in the catalyst column, while carbon dioxide and moisture are principally removed in the adsorbent column. The concentration of each of oxygen, carbon dioxide and moisture that are contained in the crude ammonia to which the process according to the present invention is applied is usually 100 ppm or lower. The concentration thereof, when being higher than 100 ppm, leads to an increase in the amount of heat generation as the case may be, thereby necessitating a means for removing heat. It is also possible as illustrated in FIG. 2 (B) to purify ammonia with only one column packed inside with both the catalyst and the synthetic zeolite.

In general, a packing length of 50 to 1500 mm is applied practically to both the packing length of the catalyst comprising manganese oxide or nickel as an effective ingredient which is packed in the catalyst column, and the packing length of the synthetic zeolite having a pore diameter of 4 to 10 Å or equivalent which is packed in the the adsorbent column. A packing length less than 50 mm causes a fear of deteriorating the removal rate of impurities, whereas a packing length more than 1500 mm causes a fear of excessive pressure loss.

The superficial linear velocity (LV) of crude ammonia at the time of ammonia purification varies depending upon the concentration of impurities in ammonia, operational conditions and the like, and thus can not be unequivocally specified, but it is usually at most 100 cm/sec, preferably at most 30 cm/sec.

The temperature of contact between ammonia and catalyst, which is the temperature of the gas supplied to the inlet of the catalyst column, is 150° C. or lower when use is made of the catalyst comprising manganese oxide as an effective ingredient, and is 100 ° C. or lower when use is made of the catalyst comprising nickel as an effective ingredient. In any of the cases, the temperature of contact therebetween may be ordinary temperature without necessitating heating or cooling. Also, the temperature of contact between ammonia and the synthetic zeolite is usually ordinary temperature. The pressure upon contact between ammonia and the catalyst or the synthetic zeolite is not specifically limited. The present process can be put into practice by any of atmospheric, reduced and elevated pressure, but usually at a pressure between atmospheric pressure and 0.3 MPa.

The present invention relates to the ammonia purification process for removing oxygen and carbon dioxide that are contained as impurities in crude ammonia by bringing the crude ammonia into contact with the catalyst comprising manganese oxide as the effective ingredient, and at need with the synthetic zeolite having a pore diameter of 4 to 10 Å or equivalent; to the ammonia purification process for removing at least one impurity selected from oxygen, carbon dioxide and moisture that are contained in crude ammonia by bringing the crude ammonia into contact with the catalyst comprising manganese oxide or nickel as the effective ingredient, and thereafter with the synthetic zeolite having a pore diameter of 4 to 10 Å or equivalent; and further to the ammonia purification process for removing at least one impurity selected from oxygen, carbon dioxide and moisture that are contained in crude ammonia available on the market for industrial use by bringing the crude ammonia into contact with the catalyst comprising manganese oxide as the effective ingredient and the catalyst comprising nickel as the effective ingredient in this order or in the reverse order, and thereafter further with the synthetic zeolite having a pore diameter of 4 to 10 Å or equivalent, or by conducting the step of bringing crude ammonia available on the market for industrial use into contact with the catalyst comprising manganese oxide as the effective ingredient, and thereafter further with the synthetic zeolite having a pore diameter of 4 to 10 Å or equivalent, and the step of bringing crude ammonia available on the market for industrial use into contact with the catalyst comprising nickel as the effective ingredient, and thereafter further with the synthetic zeolite having a pore diameter of 4 to 10 Å or equivalent, in this order or in the reverse order.

As stated hereinabove, it is made possible to efficiently remove oxygen, carbon dioxide and moisture that are contained in crude ammonia by the combination of the catalyst comprising manganese oxide as the effective ingredient and the catalyst comprising nickel as the effective ingredient, and further by the combination of any or all of the foregoing catalysts and the specific synthetic zeolite. Further, carbon monoxide, even when being mixed therein, can be removed as well.

In summarizing the working effect and advantage of the present invention, it is made possible by the ammonia purification process according to the present invention to remove to an extremely low concentration, oxygen, carbon dioxide and moisture that are contained each in a slight amount in crude ammonia, and at the same time to purify ammonnia without causing ammonia decomposition which generates hydrogen even under the conditions in which the the temperature of contact between the catalyst and ammonia is made to a relatively high level. Further, it is made possible thereby to continuously supply a gallium nitride compound semiconductor process with inexpensive ammonia which is available on the market for industrial use through the present process without distillation or rectification. Furthermore, it is made possible thereby to recover and practically recycle ammonia exhausted from a gallium nitride compound semiconductor process, thereby enabling personnel concerned to contrive environmental preservation as well as effective recycling of resources.

In what follows, the present invention will be described in more detail with reference to working examples, which however shall never limit the present invention thereto.

EXAMPLE 1

Preparation of Catalyst

To an aqueous solution of 398 g of potassium permanganate in 12.5 kg of water were promptly added a mixed solution of 8.45 kg of aqueous solution of manganese sulfate in 3% by weight concentration and 144 g of concentrated sulfuric acid to proceed with reaction at 70° C. The resultant precipitate was agitated at 90° C. for 3 hours, filtered, washed with 25 kg of ion exchanged water three times, filtered again to obtain 1200 g of cakey manganese oxide ($MnO_2$). The resultant cakey $MnO_2$ was dried at 90° C. for 12 hours to obtain 360 g of powdery $MnO_2$, which had a BET specific surface area of 245 $m^2/g$ as measured with a measuring instrument for gas adsorption quantity (manufactured by Uasa Ionics CO.,Ltd. under the trade name "Autosorb 3B").

To the resultant powdery $MnO_2$ having a BET specific surface area of 245 $m^2/g$ in an amount of 500 g were added under kneading 10 g of alumina sol and 200 g of water to obtain a cake, which was extruded with an extruder to obtain a molded product having a diameter of 1.6 mm. The resultant molded product was cut into pieces of about 10 mm in length to obtain pellets. The resultant pellets were dried at 120° C. for 12 hours to obtain Catalyst A having a moisture of 0.8% by weight.

Purification of Ammonia

The Catalyst A thus obtained was packed in a stainless steel-made catalyst column having an inside diameter of 45.2 mm and a length of 200 mm so that the packing length was made to be 150 mm. Subsequently, the temperature of the catalyst column was raised to 250° C., a mixed gas of hydrogen and nitrogen (5% by volume of hydrogen and 95% by volume of nitrogen) was passed therethrough for 5 hours at atmospheric pressure at a flow rate of 2887 ml/min.(LV of 3.0 cm/sec.) to effect reduction treatment of the Catalyst A, and thereafter the catalyst column was cooled to ordinary temperature.

Consecutively, ammonia purification was put into practice by passing crude ammonia containing 10 ppm of oxygen and 10 ppm of carbon dioxide as impurities through the catalyst column at ordinary temperature (20° C.) at a flow rate of 9622 ml/min.(LV of 10 cm/sec.). Measurements were made of the concentrations of oxygen and carbon dioxide in the outlet treated gas by the use of a heat transmission detector (GC-TCD, detectable lower limit concentration of 0.01 ppm) after 5 minutes from the start of passing the crude ammonia and thereafter at an interval of 20 minutes. The results are given in Table 1. in which N.D. stands for "Not Detected". Immediately after the start of ammonia purification, the catalyst generated heat, but hydrogen was not detected at all in the purified ammonia.

EXAMPLE 2

The powdery $MnO_2$ which had been obtained in the same manner as in Example 1 was reduced in a stream of CO to obtain MnO. In the same manner as in Example 1, to the resultant MnO were added under kneading alumina sol and water to obtain a cake, which was extruded with an extruder to obtain a molded product, which was cut into pieces to obtain pellets. The resultant pellets were dried obtain Catalyst B having a moisture of 0.7% by weight.

Subsequently, the procedure in Example 1 was repeated to carry out ammonia purification except that the Catalyst B was employed in place of the Catalyst A. The results are given in Table 1.

EXAMPLE 3

The powdery $MnO_2$ which had been obtained in the same manner as in Example 1 was ignited at around 1000° C. in a stream of oxygen to obtain $Mn_3O_4$. In the same manner as in Example 1, to the resultant $Mn_3O_4$ were added under kneading alumina sol and water to obtain a cake, which was extruded with an extruder to obtain a molded product, which was cut into pieces to obtain pellets. The resultant pellets were dried obtain Catalyst C having a moisture of 0.7% by weight.

Subsequently, the procedure in Example 1 was repeated to carry out ammonia purification except that the Catalyst C was employed in place of the Catalyst A. The results are given in Table 1.

EXAMPLE 4

$MnCO_3$ which had been procured from the market was heated at around 700° C. in the air to obtain $Mn_2O_3$. In the same manner as in Example 1, to the resultant $Mn_2O_3$ were added under kneading alumina sol and water to obtain a cake, which was extruded with an extruder to obtain a molded product, which was cut into pieces to obtain pellets. The resultant pellets were dried obtain Catalyst D having a moisture of 0.8% by weight.

Subsequently, the procedure in Example 1 was repeated to carry out ammonia purification except that the Catalyst C was employed in place of the Catalyst A. The results are given in Table 1.

TABLE 1

| | | Measurement Results of Impurities after Purification | | | | | |
|---|---|---|---|---|---|---|---|
| Example | | after 5 min. | | after 25 min. | | after 45 min. | |
| No. | Catalyst | $O_2$ | $CO_2$ | $O_2$ | $CO_2$ | $O_2$ | $CO_2$ |
| 1 | $MnO_2$ | N.D. | N.D. | N.D. | N.D. | N.D. | N.D. |
| 2 | MnO | N.D. | N.D. | N.D. | N.D. | N.D. | N.D. |
| 3 | $Mn_3O_4$ | N.D. | N.D. | N.D. | N.D. | N.D. | N.D. |
| 4 | $Mn_2O_3$ | N.D. | N.D. | N.D. | N.D. | N.D. | N.D. |

EXAMPLE 5

The Catalyst A was packed in a stainless steel-made catalyst column having an inside diameter of 45.2 mm and a length of 200 mm so that the packing length was made to be 150 mm. Marketed synthetic zeolite having a pore diameter of 4 Å or equivalent (Molecular Sieves 4A, available from Union Carbide Corporation) was packed in a stainless steel-made adsorption column which was placed on the downstream side of the catalyst column and which had an inside diameter of 45.2 mm and a length of 200 mm so that the packing length was made to be 150 mm. Subsequently, the temperature of the catalyst column was raised to 250° C., a mixed gas of hydrogen and nitrogen (5% by volume of hydrogen and 95% by volume of nitrogen) was passed towards the adsorption column for 5 hours at atmospheric pressure at a flow rate of 2887 ml/min. (LV of 3.0 cm/sec.) to carry out reduction treatment of the Catalyst A, and thereafter the catalyst column was cooled to ordinary temperature. Further, the temperature of the adsorption column was raised to 350° C., nitrogen was passed towards the catalyst column for 4 hours at atmospheric pressure at a flow rate of 2887 ml/min. (LV of 3.0 cm/sec.) to carry out activation treatment of the synthetic zeolite, and thereafter the adsorption column was cooled to ordinary temperature.

Consecutively, ammonia purification was put into practice by passing crude amimia containing 10 ppm of oxygen and 10 ppm of carbon dioxide and 50 ppm of moisture as impurities through the catalyst column and the adsorption column in this order at ordinary temperature (20° C. ) at a flow rate of 9622 l/min.(LV of 10 cm/sec.). Thus measurements were made of the concentrations of oxygen, carbon dioxide and moisture in the outlet treated gas by the use of a heat conductivity detector (GC-TCD, detectable lower limit concentration of 0.01 ppm) and a hydrogen flame ionization detector (GC-FID, detectable limit concentration of 0.01 ppm) and a Fourier transformation infrared spectrophotometer (FT-IR, detectable lower limit concentration of 0.01 ppm) after 5 minutes from the start of passing the crude ammonia and thereafter at an interval of 20 minutes, respectively. The results are given in Table 2. Immediately after the start of ammonia purification, the catalyst generated heat, but hydrogen was not detected at all in the purified ammonia.

EXAMPLES 6 to 8

The procedure in Example 5 was repeated to carry out ammonia purification except that the Catalyst B, C and D were employed in Examples 6, 7 and 8, respectively in place of the Catalyst A. The results are given in Table 2.

EXAMPLES 9 to 10

The procedure in Example 5 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 X, available from Union Carbide Corporation) were employed in Examples 9 an 10, respectively in place of the synthetic zeolite of 4 Å equivalent. The results are given in Table 2.

TABLE 2-1

| Example No. | Catalyst | Synthetic Zeolite Pore S' | Measurement Results of Impurities after Purification | | | | | |
|---|---|---|---|---|---|---|---|---|
| | | | after 5 min. | | | after 25 min. | | |
| | | | $O_2$ | $CO_2$ | $H_2O$ | $O_2$ | $CO_2$ | $H_2O$ |
| 5 | $MnO_2$ | 4Å | N.D. | N.D. | N.D. | N.D. | N.D. | N.D. |
| 6 | MnO | 4Å | N.D. | N.D. | N.D. | N.D. | N.D. | N.D. |
| 7 | $Mn_3O_4$ | 4Å | N.D. | N.D. | N.D. | N.D. | N.D. | N.D. |
| 8 | $Mn_2O_3$ | 4Å | N.D. | N.D. | N.D. | N.D. | N.D. | N.D. |
| 9 | $MnO_2$ | 5Å | N.D. | N.D. | N.D. | N.D. | N.D. | N.D. |
| 10 | $MnO_2$ | 10Å | N.D. | N.D. | N.D. | N.D. | N.D. | N.D. |

{Remarks}S': System

TABLE 2-2

| Example No. | Catalyst | Synthetic Zeolite Pore S' | Measurement Results of Impurities after Purification after 45 min. | | |
|---|---|---|---|---|---|
| | | | $O_2$ | $CO_2$ | $H_2O$ |
| 5 | $MnO_2$ | 4 Å | N.D. | N.D. | N.D. |
| 6 | MnO | 4 Å | N.D. | N.D. | N.D. |
| 7 | $Mn_3O_4$ | 4 Å | N.D. | N.D. | N.D. |
| 8 | $Mn_2O_3$ | 4 Å | N.D. | N.D. | N.D. |
| 9 | $MnO_2$ | 5 Å | N.D. | N.D. | N.D. |
| 10 | $MnO_2$ | 10 Å | N.D. | N.D. | ND. |

{Remarks} S': System

EXAMPLE 11

The procedure in Example 5 was repeated to carry out ammonia purification except that use was made of nitrogen-based crude ammonia in 10% by volume containing as impurities, 5 ppm of oxygen, 5 ppm of carbon dioxide and 60 ppm of moisture. The results are given in Table 3.

EXAMPLES 12 to 14

The procedure in Example 11 was repeated to carry out ammonia purification except that the Catalyst B, C and D were employed in Examples 12, 13 and 14, respectively in place of the Catalyst A. The results are given in Table 3.

EXAMPLES 15 to 16

The procedure in Example 11 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 X, available from Union Carbide Corporation) were employed in Examples 15 and 16, respectively in place of the synthetic zeolite of 4 Å equivalent. The results are given in Table 3.

TABLE 3-1

| Example No. | Catalyst | Synthetic Zeolite Pore S' | Measurement Results of Impurities after Purification | | | | | |
|---|---|---|---|---|---|---|---|---|
| | | | after 5 min. | | | after 25 min. | | |
| | | | $O_2$ | $CO_2$ | $H_2O$ | $O_2$ | $CO_2$ | $H_2O$ |
| 11 | $MnO_2$ | 4Å | N.D. | N.D. | N.D. | N.D. | N.D. | N.D. |
| 12 | MnO | 4Å | N.D. | N.D. | N.D. | N.D. | N.D. | N.D. |
| 13 | $Mn_3O_4$ | 4Å | N.D. | N.D. | N.D. | N.D. | N.D. | N.D. |
| 14 | $Mn_2O_3$ | 4Å | N.D. | N.D. | N.D. | N.D. | N.D. | N.D. |
| 15 | $MnO_2$ | 5Å | N.D. | N.D. | N.D. | N.D. | N.D. | N.D. |
| 16 | $MnO_2$ | 10Å | N.D. | N.D. | N.D. | N.D. | N.D. | N.D. |

{Remarks}S': System

TABLE 3-2

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 11 | $MnO_2$ | 4 Å | N.D. | N.D. | N.D. |
| 12 | MnO | 4 Å | N.D. | N.D. | N.D. |
| 13 | $Mn_3O_4$ | 4 Å | N.D. | N.D. | N.D. |
| 14 | $Mn_2O_3$ | 4 Å | N.D. | N.D. | N.D. |

TABLE 3-2-continued

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 15 | $MnO_2$ | 5 Å | N.D. | N.D. | N.D. |
| 16 | $MnO_2$ | 10 Å | N.D. | N.D. | N.D. |

{Remarks} S': System

EXAMPLE 17
Purification of Ammonia

The Catalyst A which had been prepared in Example 1 was packed in a stainless steel-made catalyst column having an inside diameter of 45.2 mm and a length of 200 mm so that the packing length was made to be 150 mm. Marketed synthetic zeolite having a pore diameter of 4 Å equivalent (Molecular Sieves 4A, available from Union Carbide Corporation) was packed in a stainless steel-made adsorption column which was placed on the downstream side of the catalyst column and which had an inside diameter of 45.2 mm and a length of 200 mm so that the packing length was made to be 150 mm. Subsequently, the temperature of the catalyst column was raised to 250° C., a mixed gas of hydrogen and nitrogen (5% by volume of hydrogen and 95% by volume of nitrogen) was passed from the adsorption column for 5 hours at atmospheric pressure at a flow rate of 2887 ml/min.(LV of 3.0 cm/sec.) to carry out reduction treatment of the Catalyst A, and thereafter the catalyst column was cooled to ordinary temperature. Further, the temperature of the adsorption column was raised to 350° C., nitrogen was passed towards the catalyst column for 4 hours at atmospheric pressure at a flow rate of 2887 ml/min.(LV of 3.0 cm/sec.) to carry out activation treatment of the synthetic zeolite, and thereafter the adsorption column was cooled to ordinary temperature.

Crude ammonia available on the market for industrial use was chemically analyzed by the use of a heat conductivity detector (GC-TCD), a hydrogen flame ionization detector (GC-FID) and a Fourier transformation infrared spectrophotometer (FT-IR). As a result, the crude ammonia contained nitrogen, hydrogen, oxygen, carbon dioxide and moisture as impurities, in amounts of 15 ppm, 23 ppm, 3 ppm, 5 ppm and 60 ppm, respectively. Then, ammonia purification was put into practice by passing the crude ammonia for industrial use through the catalyst column and the adsorption column in this order at ordinary temperature and atmospheric pressure at a flow rate of 9622 ml/min.(LV of 10 cm/sec.) for one hour. Thus measurements were made of the concentrations of oxygen, carbon dioxide and moisture in the outlet treated gas by the use of the heat conductivity detector (GC-TCD), the hydrogen flame ionization detector (GC-FID) and the Fourier transformation infrared spectrophotometer (FT-IR), each having a detectable lower limit concentration of 0.01 ppm, after 5 minutes from the start of passing the crude ammonia and thereafter at an interval of 20 minutes, respectively. The results are given in Table 4.

EXAMPLE 18

The procedure in Example 17 was repeated to carry out ammonia purification except that the Catalyst B which had been prepared in Example 2 was employed in place of the Catalyst A. The results are given in Table 4.

EXAMPLE 19

The procedure in Example 17 was repeated to carry out ammonia purification except that the Catalyst C which had been prepared in Example 3 was employed in place of the Catalyst A. The results are given in Table 4.

EXAMPLE 20

The procedure in Example 17 was repeated to carry out ammonia purification except that the Catalyst D which had been prepared in Example 4 was employed in place of the Catalyst A. The results are given in Table 4.

EXAMPLES 21 to 22

The procedure in Example 17 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 X, available from Union Carbide Corporation) were employed in Examples 21 and 22, respectively in place of the synthetic zeolite of 4 Å equivalent. The results are given in Table 4.

EXAMPLES 23

Catalyst E was prepared by crushing into 10 to 20 mesh, a marketed nickel catalyst in the form of molded product (available from JGC Corporation under the trade name "N-111") which was in the form of Ni+NiO, and which had a chemical composition consisting of 45 to 47% by weight of Ni, 2 to 3% by weight of Cr, 2 to 3% by weight of Cu, 27 to 29% by weight of diatomaceous earth and 4 to 5% by weight of graphite, a specific surface area of 150 m²/g, a diameter of 5 mm and a height of 4.5 mm.

Subsequently, the procedure in Example 17 was repeated to carry out ammonia purification except that the Catalyst E was employed in place of the Catalyst A in Example 17. The results are given in Table 4.

EXAMPLES 24

Catalyst F having nickel oxide (NiO) content of 29% by weight was prepared by a method comprising the steps of dissolving 454 g of $Al(NO_3)_3 \cdot 9H_2O$ in 3 litter of water under cooling on an ice bath; adding dropwise to the resultant solution with vigorous stirring over a period of 2 hours, a solution of 200 g of NaOH in one litter of water which was cooled to 5 to 10° C. to prepare sodium alminate; adding dropwise to the solution of sodium alminate thus obtained with vigorous stirring over a period of one hour, a solution of 101 g of $Ni(NO_3)_3 \cdot 6H_2O$ in 600 ml of water which was incorporated with 45 ml of concentrated nitric acid and cooled to 5 to 10° C. to prepare a precipitate; filtrating and then washing the resultant precipitate in 2 litter of water with stirring for 15 minutes 6 times repeatedly to obtain neutral product; finely dividing the neutral precipitate; drying the same at 105° C. in an air bath for 16 hours followed by grinding; sieving the ground product; and collecting 12 to 24 mesh product as Catalyst F.

Subsequently, the procedure in Example 17 was repeated to carry out ammonia purification except that the Catalyst F was employed in place of the Catalyst A. The results are given in Table 4.

EXAMPLES 25 to 26

The procedure in Example 23 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 A, available from Union Carbide Corporation) were employed in Examples 25 and 26, respectively in place of the synthetic zeolite of 4 Å equivalent in Example 23. The results are given in Table 4.

TABLE 4-1

| Example No. | Synthetic Catalyst | Zeolite Pore S' | Measurement Results of Impurities after Purification | | | | | |
|---|---|---|---|---|---|---|---|---|
| | | | after 5 min. | | | after 25 min. | | |
| | | | $O_2$ | $CO_2$ | $H_2O$ | $O_2$ | $CO_2$ | $H_2O$ |
| 17 | $MnO_2$ | 4Å | N.D. | N.D. | N.D. | N.D. | N.D. | N.D. |
| 18 | MnO | 4Å | N.D. | N.D. | N.D. | N.D. | N.D. | N.D. |
| 19 | $Mn_3O_4$ | 4Å | N.D. | N.D. | N.D. | N.D. | N.D. | N.D. |
| 20 | $Mn_2O_3$ | 4Å | N.D. | N.D. | N.D. | N.D. | N.D. | N.D. |
| 21 | $MnO_2$ | 5Å | N.D. | N.D. | N.D. | N.D. | N.D. | N.D. |
| 22 | $MnO_2$ | 10Å | N.D. | N.D. | N.D. | N.D. | N.D. | N.D. |
| 23 | Ni, NiO | 4Å | N.D. | N.D. | N.D. | N.D. | N.D. | N.D. |
| 24 | NiO | 4Å | N.D. | N.D. | N.D. | N.D. | N.D. | N.D. |
| 25 | Ni, NiO | 5Å | N.D. | N.D. | N.D. | N.D. | N.D. | N.D. |
| 26 | Ni, NiO | 10Å | N.D. | N.D. | N.D. | N.D. | N.D. | N.D. |

{Remarks}S': System

TABLE 4-2

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 17 | $MnO_2$ | 4 Å | N.D. | N.D. | N.D. |
| 18 | MnO | 4 Å | N.D. | N.D. | N.D. |
| 19 | $Mn_3O_4$ | 4 Å | N.D. | N.D. | ND. |
| 20 | $Mn_2O_3$ | 4 Å | N.D. | N.D. | N.D. |
| 21 | $MnO_2$ | 5 Å | N.D. | N.D. | N.D. |
| 22 | $MnO_2$ | 10 Å | N.D. | N.D. | N.D. |
| 23 | Ni,NiO | 4 Å | N.D. | N.D. | N.D. |
| 24 | NiO | 4 Å | N.D. | N.D. | N.D. |
| 25 | Ni,NiO | 5 Å | N.D. | N.D. | N.D. |
| 26 | Ni,NiO | 10 Å | N.D. | N.D. | N.D. |

{Remarks} S': System

EXAMPLES 27

Ammonia Recovery from Gallium Nitride Compound Semiconductor

Ammonia was recovered from exhaust gas containing a large amount of nitrogen and hydrogen by carrying out crystal growth of GaN on a sapphire substrate having a diameter of 2 inches using ammonia purified in the same manner as in Example 17, and applying an ammonia recovery unit as illustrated in FIG. 3 which had been developed by the present applicant {Japanese Patent Application Laid Open No. 317246/2000 (Heisei 12)} to the outlet side of the exhaust gas from the semiconductor process.

The ammonia recovery unit was constituted of two sets of multi-tube adsorbers which were each incorporated with 19 numbers of SUS-316L-made adsorption tubes each having an inside diameter of 108.3 mm and a length of 1500 mm and which had such constitution that enabled a heat transfer medium to pass through the space between the adsorption tubes and the shell. Each of the adsorbers was packed inside with 250 litter of molecular sieve 5A as the adsorbent. In addition, to each of the adsorbers were connected a vacuum pump, a pressurizing pump, a buffer tank, a surge tank and a recovered ammonia tank, and a cooling water line and a heating water line were connected so as to enable alternate changeover.

Subsequently, ammonia adsorption was carried out by supplying the adsorber 10 of the ammonia recovery unit with ammonia-containing exhaust gas at ordinary temperature and atmospheric pressure, while cooling the inside of the adsorption tubes by passing cooling water at 25° C. through the inside of the shell. The ammonia adsorption was continued for 5 hours and thereafter, the supply of the ammonia-containing gas was switched to the adsorber 10'.

During the ammonia adsorption, ammonia effluence was not recognized in the outlet gas from the adsorber 10. The inside of the adsorption tubes 11 was evacuated under reduced pressure with the vacuum pump 19 for a short time of one minute in a state of maintaining the inside of the adsorption tubes 11 at around ordinary temperature, during which time the exhaust gas was introduced in the surge tank 28.

Then the exhaust line of the vacuum pump 19 was switched to the sides of the buffer tank 23 and the recovered ammonia tank 26. At the same time, the cooling water for the adsorber 10 was switched to the heating water at 90° C., which was supplied to the inside of the shell so as to heat the inside of the adsorption tubes 11, while running the pressurizing pump 24. In this manner the vacuum evacuation procedure was continued for 3 hours under heating to complete the ammonia recovery operation. Thereafter, measurements were made of the concentrations in ppm of nitrogen, hydrogen, oxygen, carbon dioxide and moisture which had been contained as impurities in the recovered ammonia. As the results, the concentrations thereof were proved to be 15, 12, 2.0, 1,2 and 1.4 ppm, respectively.

Purification of Ammonia

Catalyst A was packed in a stainless steel-made catalyst column having an inside diameter of 45.2 mm and a length of 200 mm so that the packing length was made to be 150 mm. Marketed synthetic zeolite having a pore diameter of 4 Å equivalent (Molecular Sieves 4A, available from Union Carbide Corporation) was packed in a stainless steel-made adsorption column which was placed on the downstream side of the catalyst column and which had an inside diameter of 45.2 mm and a length of 200 mm so that the packing length was made to be 150 mm. Subsequently, the temperature of the catalyst column was raised to 250° C., a mixed gas of hydrogen and nitrogen (5% by volume of hydrogen and 95% by volume of nitrogen) was passed towards the adsorption column for 5 hours at atmospheric pressure at a flow rate of 2887 ml/min.(LV of 3.0 cm/sec.) to carry out reduction treatment of the Catalyst A, and thereafter the catalyst column was cooled to ordinary temperature. Further, the temperature of the adsorption column was raised to 350° C., nitrogen was passed towards the catalyst column for 4 hours at atmospheric pressure at a flow rate of 2887 ml/min.(LV of 3.0 cm/sec.) to carry out activation treatment of the synthetic zeolite, and thereafter the adsorption column was cooled to ordinary temperature.

Subsequently, ammonia purification was put into practice by passing the crude ammonia which had been recovered from the gallium nitride compound semiconductor process in the above mentioned manner towards the catalyst column at ordinary temperature and at atmospheric pressure at a flow rate of 9622 ml/min.(LV of 10 cm/sec.) for one hour. Thus measurements were made of the concentrations of oxygen, carbon dioxide and moisture in the outlet treated gas by the use of GC-TCD, GC-FID and FT-IR, after 5 minutes from the start of passing the crude ammonia and thereafter at an interval of 20 minutes, respectively. The results are given in Table 5.

EXAMPLES 28 to 30

The procedure in Example 27 was repeated to carry out ammonia purification except that the Catalyst B, C and D were employed in Examples 28, 29 and 30, respectively in place of the Catalyst A. The results are given in Table 5.

EXAMPLES 31 to 32

The procedure in Example 27 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 X, available from Union Carbide Corporation) were employed in Examples 31 and 32, respectively in place of the synthetic zeolite of 4 Å equivalent. The results are given in Table 5.

EXAMPLE 33

The procedure in Example 27 was repeated to carry out ammonia purification except that the Catalyst E was employed in place of the Catalyst A. The results are given in Table 5.

EXAMPLE 34

The procedure in Example 27 was repeated to carry out ammonia purification except that the Catalyst F was employed in place of the Catalyst A. The results are given in Table 5.

EXAMPLES 35 to 36

The procedure in Example 33 was repeated to carry out ammonia purification except that synthetic zeolite of 5 Å equivalent (Molecular Sieves 5 A, available from Union Carbide Corporation) and synthetic zeolite of 10 Å equivalent (Molecular Sieves 13 X, available from Union Carbide Corporation) were employed in Examples 35 and 36, respectively in place of the synthetic zeolite of 4 Å equivalent.

The results are given in Table 5.

TABLE 5-1

| Example No. | Catalyst | Synthetic Zeolite Pore S' | Measurement Results of Impurities after Purification | | | | | |
|---|---|---|---|---|---|---|---|---|
| | | | after 5 min. | | | after 25 min. | | |
| | | | $O_2$ | $CO_2$ | $H_2O$ | $O_2$ | $CO_2$ | $H_2O$ |
| 27 | $MnO_2$ | 4Å | N.D. | N.D. | N.D. | N.D. | N.D. | N.D. |
| 28 | MnO | 4Å | N.D. | N.D. | N.D. | N.D. | N.D. | N.D. |
| 29 | $Mn_3O_4$ | 4Å | N.D. | N.D. | N.D. | N.D. | N.D. | N.D. |
| 30 | $Mn_2O_3$ | 4Å | N.D. | N.D. | N.D. | N.D. | N.D. | N.D. |
| 31 | $MnO_2$ | 5Å | N.D. | N.D. | N.D. | N.D. | N.D. | N.D. |
| 32 | $MnO_2$ | 10Å | N.D. | N.D. | N.D. | N.D. | N.D. | N.D. |
| 33 | Ni, NiO | 4Å | N.D. | N.D. | N.D. | N.D. | N.D. | N.D. |
| 34 | NiO | 4Å | N.D. | N.D. | N.D. | N.D. | N.D. | N.D. |
| 35 | Ni, NiO | 5Å | N.D. | N.D. | N.D. | N.D. | N.D. | N.D. |
| 36 | Ni, NiO | 10Å | N.D. | N.D. | N.D. | N.D. | N.D. | N.D. |

{Remarks}S': System

TABLE 5-2

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 27 | $MnO_2$ | 4 Å | N.D. | N.D. | N.D. |
| 28 | MnO | 4 Å | N.D. | N.D. | N.D. |
| 29 | $Mn_3O_4$ | 4 Å | N.D. | N.D. | N.D. |
| 30 | $Mn_2O_3$ | 4 Å | ND. | N.D. | N.D. |

TABLE 5-2-continued

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 31 | $MnO_2$ | 5 Å | N.D. | N.D. | N.D. |
| 32 | $MnO_2$ | 10 Å | N.D. | N.D. | N.D. |
| 33 | Ni,NiO | 4 Å | N.D. | N.D. | N.D. |
| 34 | NiO | 4 Å | N.D. | N.D. | N.D. |
| 35 | Ni,NiO | 5 Å | N.D. | N.D. | N.D. |
| 36 | Ni,NiO | 10 Å | N.D. | ND. | N.D. |

{Remarks} S': System

EXAMPLES 37

Catalysts A and E were each packed in a stainless steel-made catalyst column having an inside diameter of 45.2 mm and a length of 200 mm so that the packing length was made to be each 75 mm, and the catalysts A and E were placed on the upstream side and the downstream side, respectively. Marketed synthetic zeolite having a pore diameter of 4 Å equivalent (Molecular Sieves 4A, available from Union Carbide Corporation) was packed in a stainless steel-made adsorption column which was placed on the downstream side of the catalyst column and which had an inside diameter of 45.2 mm and a length of 200 mm so that the packing length was made to be 150 mm. Subsequently, there were carried out in the same manner as in Example 17, the reduction treatments of the Catalysts A and E, and the activation treatment of the synthetic zeolite.

Thereafter, ammonia purification was carried out in the same manner as in Example 17. The results are given in Table 6.

EXAMPLES 38

The procedure in Example 37 was repeated to carry out ammonia purification except that the packing positions were exchanged between the Catalysts A and E so that the catalysts A and E were placed on the downstream side and the upstream side, respectively. The results are given in Table 6.

TABLE 6-1

| Example No. | Catalyst | Synthetic Zeolite Pore S' | Measurement Results of Impurities after Purification | | | | | |
|---|---|---|---|---|---|---|---|---|
| | | | after 5 min. | | | after 25 min. | | |
| | | | $O_2$ | $CO_2$ | $H_2O$ | $O_2$ | $CO_2$ | $H_2O$ |
| 37 | $MnO_2$—Ni | 4Å | N.D. | N.D. | N.D. | N.D. | N.D. | N.D. |
| 38 | Ni—$MnO_2$ | 4Å | N.D. | N.D. | N.D. | N.D. | N.D. | N.D. |

TABLE 6-2

| Example No. | Catalyst | Example Synthetic Zeolite Pore S' | Measurement Results of Impurities after Purification after 45 min. | | |
|---|---|---|---|---|---|
| | | | $O_2$ | $CO_2$ | $H_2O$ |
| 37 | $MnO_2$—Ni | 4 Å | N.D. | N.D. | N.D. |
| 38 | Ni—$MnO_2$ | 4 Å | N.D | N.D. | N.D. |

What is claimed is:

1. A process for purifying ammonia which comprises bringing crude ammonia into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia.

2. A process for purifying ammonia for a gallium nitride compound semiconductor which comprises bringing crude ammonia into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia.

3. A process for purifying ammonia for a gallium nitride compound semiconductor which comprises bringing crude ammonia into contact with a catalyst comprising nickel as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia.

4. A process for purifying ammonia for a gallium nitride compound semiconductor which comprises bringing crude ammonia into contact with a catalyst comprising manganese oxide as an effective ingredient and with a catalyst comprising nickel as an effective ingredient consecutively in this order, and thereafter bringing the ammonia into contact with a synthetic zeolite having a pore diameter in the range of 4 to 10 Å to remove at least one impurity selected from the group consisting of oxygen, carbon dioxide and moisture that are contained in the crude ammonia.

5. A process for purifying ammonia for a gallium nitride compound semiconductor which comprises bringing crude ammonia into contact with a catalyst comprising nickel as an effective ingredient and with a catalyst comprising manganese oxide as an effective ingredient consecutively in this order, and thereafter bringing the ammonia into contact with a synthetic zeolite having a pore diameter in the range of 4 to 10 Å to remove at least one impurity selected from the group consisting of oxygen, carbon dioxide and moisture that are contained in the crude ammonia.

6. A process for purifying ammonia for a gallium nitride compound semiconductor which comprises the step of bringing crude ammonia into contact with a catalyst comprising manganese oxide as an effective ingredient, and thereafter with a synthetic zeolite having a pore diameter in the range of 4 to 10 Å and the step of bringing the ammonia from the synthetic zeolite into contact with a catalyst comprising nickel as an effective ingredient, and thereafter with a synthetic zeolite having a pore diameter in the range of 4 to 10 Å consecutively in this order to remove at least one impurity selected from the group consisting of oxygen, carbon dioxide and moisture that are contained in the crude ammonia.

7. A process for purifying ammonia for a gallium nitride compound semiconductor which comprises a step of bringing crude ammonia into contact with a catalyst comprising nickel as an effective ingredient, and thereafter with a synthetic zeolite having a pore diameter in the range of 4 to 10 Å and a step of bringing the ammonia from the synthetic zeolite into contact with a catalyst comprising manganese oxide as an effective ingredient, and thereafter with a synthetic zeolite having a pore diameter in the range of 4 to 10 Å consecutively in this order to remove at least one impurity selected from the group consisting of oxygen, carbon dioxide and moisture that are contained in the crude ammonia.

8. A process for purifying ammonia for a gallium nitride compound semiconductor which comprises bringing crude ammonia recovered from a gallium nitride compound semiconductor process into contact with a catalyst comprising manganese oxide as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia.

9. A process for purifying ammonia for a gallium nitride compound semiconductor which comprises bringing crude ammonia recovered from a gallium nitride compound semiconductor process into contact with a catalyst comprising nickel as an effective ingredient, and thereafter with a synthetic zeolite having a pore diameter in the range of 4 to 10 Å to remove at least one impurity selected from the group consisting of oxygen, carbon dioxide and moisture that are contained in the crude ammonia.

10. The process for purifying ammonia according to any of claims 2 to 7, wherein the crude ammonia has a purity in the range of 99.9 to 99.99%.

11. The process for purifying ammonia according to any of claims 2 or 4 to 8, wherein the content of the manganese oxide is at least 70% by weight based on the total weight of the calalyst comprising manganese oxide as the effective ingredient.

12. The process for purifying ammonia according to any of claims 3 to 7 or 9, wherein the content of the nickel is in the range of 5 to 95% by weight based on the total weight of the catalyst comprising nickel as the effective ingredient.

13. The process for purifying ammonia according to any of claims 2 or 4 to 8, wherein the manganese oxide has a BET specific surface area in the range of 10 to 500 $m^2/g$.

14. The process for purifying ammonia according to any of claims 3 to 7 or 9, wherein the catalyst comprising nickel as the effective ingredient has a BET specific surface area in the range of 10 to 300 $m^2/g$.

15. The process for purifying ammonia according to any of claims 2 or 4 to 8, wherein the manganese oxide is at least one species selected from the group consisting of MnO, $Mn_3O_4$, $Mn_2O_3$ and $MnO_2$.

16. The process for purifying ammonia according to any of claims 2 or 4 to 8, wherein the temperature of contact between the crude ammonia and the catalyst comprising manganese oxide as the effective ingredient is 500° C. at the highest.

17. The process for purifying ammonia according to any of claims 3 to 7 or 9, wherein the temperature of contact between the crude ammonia and the catalyst comprising nickel as the effective ingredient is 100° C. at the highest.

* * * * *

UNITED STATES PATENT AND TRADEMARK OFFICE
CERTIFICATE OF CORRECTION

PATENT NO. : 6,749,819 B2
DATED : June 15, 2004
INVENTOR(S) : Otsuka et al.

It is certified that error appears in the above-identified patent and that said Letters Patent is hereby corrected as shown below:

<u>Title page</u>,
Item [75], Inventors, should read:
-- [75] Inventors: Kenji Otsuka, Kanagawa-ken (JP);
      Satoshi Arakawa, Kanagawa-ken (JP);
      Takashi Kasaya, Kanagawa-ken (JP);
      Tomohisa Ikeda, Kanagawa-ken (JP) --

Signed and Sealed this

Sixteenth Day of November, 2004

JON W. DUDAS
*Director of the United States Patent and Trademark Office*